(12) United States Patent
Lee et al.

(10) Patent No.: US 11,062,955 B2
(45) Date of Patent: Jul. 13, 2021

(54) VERTICAL TRANSISTORS HAVING UNIFORM CHANNEL LENGTH

(71) Applicant: INTERNATIONAL BUSINESS MACHINES CORPORATION, Armonk, NY (US)

(72) Inventors: Choonghyun Lee, Rensselaer, NY (US); Takashi Ando, Tuckahoe, NY (US); Jingyun Zhang, Albany, NY (US); Alexander Reznicek, Troy, NY (US); Pouya Hashemi, Purchase, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 87 days.

(21) Appl. No.: 16/364,651

(22) Filed: Mar. 26, 2019

(65) Prior Publication Data

US 2020/0312722 A1     Oct. 1, 2020

(51) Int. Cl.

| H01L 21/8234 | (2006.01) |
| H01L 29/78 | (2006.01) |
| H01L 27/088 | (2006.01) |
| H01L 29/10 | (2006.01) |
| H01L 21/8238 | (2006.01) |

(52) U.S. Cl.
CPC ........... *H01L 21/823487* (2013.01); *H01L 21/823412* (2013.01); *H01L 21/823418* (2013.01); *H01L 21/823437* (2013.01); *H01L 21/823814* (2013.01); *H01L 27/088* (2013.01); *H01L 29/1029* (2013.01); *H01L 29/7827* (2013.01)

(58) Field of Classification Search
CPC combination set(s) only.
See application file for complete search history.

(56) References Cited

U.S. PATENT DOCUMENTS

| 9,299,835 | B1 | 3/2016 | Anderson et al. |
| 9,614,091 | B2 | 4/2017 | Colinge et al. |
| 10,037,919 | B1 | 7/2018 | Xie et al. |
| 10,084,055 | B2 | 9/2018 | Bao et al. |
| 10,090,303 | B2 | 10/2018 | Cheng |
| 10,141,448 | B1 | 11/2018 | Miao et al. |
| 10,170,590 | B2 | 1/2019 | Cheng et al. |
| 2015/0372149 | A1 | 12/2015 | Colinge et al. |
| 2018/0350695 | A1 | 12/2018 | Cheng et al. |
| 2019/0067115 | A1* | 2/2019 | Park ............... H01L 29/66545 |

* cited by examiner

*Primary Examiner* — Ratisha Mehta
(74) *Attorney, Agent, or Firm* — Tutunjian & Bitetto, P.C.; Robert Sullivan

(57) ABSTRACT

A method for fabricating a semiconductor device including vertical transistors having uniform channel length includes defining a channel length of at least one first fin formed on a substrate in a first device region and a channel length of at least one second fin formed on the substrate in a second device region. Defining the channel lengths includes creating at least one divot in the second device region. The method further includes modifying the channel length of the at least one second fin to be substantially similar to the channel length of the at least one first fin by filling the at least one divot with additional gate conductor material.

20 Claims, 10 Drawing Sheets

VERTICAL TRANSISTORS HAVING UNIFORM CHANNEL LENGTH

BACKGROUND

The present invention generally relates to semiconductor devices, and more particularly to vertical transistor devices having uniform channel length and methods of forming the same.

Vertical transistors such as, e.g., vertical field-effect transistors (VFETs) can be used as a viable complementary metal-oxide semiconductor (CMOS) architecture beyond 7 nm node. Combinations of work function metals can be used to achieve various threshold voltages in CMOS devices.

SUMMARY

In accordance with an embodiment of the present invention, a method for fabricating a semiconductor device including vertical transistors having uniform channel length is provided. The method includes defining a channel length of at least one first fin formed on a substrate in a first device region and a channel length of at least one second fin formed on the substrate in a second device region. Defining the channel lengths includes creating at least one divot in the second device region. The method further includes modifying the channel length of the at least one second fin to be substantially similar to the channel length of the at least one first fin by filling the at least one divot with additional gate conductor material.

In accordance with another embodiment of the present invention, a method for fabricating a semiconductor device including vertical transistors having uniform channel length is provided. The method includes forming first gate material in a first device region associated with a p-type field-effect transistor device, including depositing a first gate dielectric layer along at least one first fin structure including at least one first fin formed on a substrate in the first device region and at least one first bottom spacer formed on at least one first bottom source/drain region, and depositing first gate conductor material including a layer of a first material on the first gate dielectric layer. The method further includes forming second gate material in a second device region associated with an n-type field-effect transistor device, including depositing a second gate dielectric layer along at least one second fin structure including at least one first fin formed on the substrate in the second device region and at least one second bottom spacer formed on at least one second bottom source/drain region, and depositing second gate conductor material on the second gate dielectric layer. The second gate conductor material includes a stack having a plurality of layers including a layer of the first material and a layer of a second material having a different etch rate from the first material. The method further includes defining a channel length of the at least one first fin and a channel length of the at least one second fin. Defining the channel lengths includes recessing the first and second gate material using a vertical wet etch process. The recessing creates at least one divot in the second device region resulting from over etch. The method further includes modifying the channel length of the at least one second fin to be substantially similar to the channel length of the at least one first fin by filling the at least one divot with additional gate conductor material to create at least one seam.

In accordance with yet another embodiment of the present invention, a semiconductor device including vertical transistors having uniform channel length is provided. The device includes a first device formed on a substrate in a first region and a second device formed on the substrate in a second region. The first device includes at least one first bottom source/drain region, at least one first top source/drain region, at least one first fin having a channel length, and first gate material including first gate conductor material. The first gate conductor material includes a layer of a first material. The second device includes at least one second bottom source/drain region, at least one second top source/drain region, at least one second fin having the channel length, and second gate material including second gate conductor material. The second gate conductor material includes a stack having a plurality of layers. The plurality of layers of the stack include a layer of the first material and a layer of a second material having a different etch rate from the first material.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
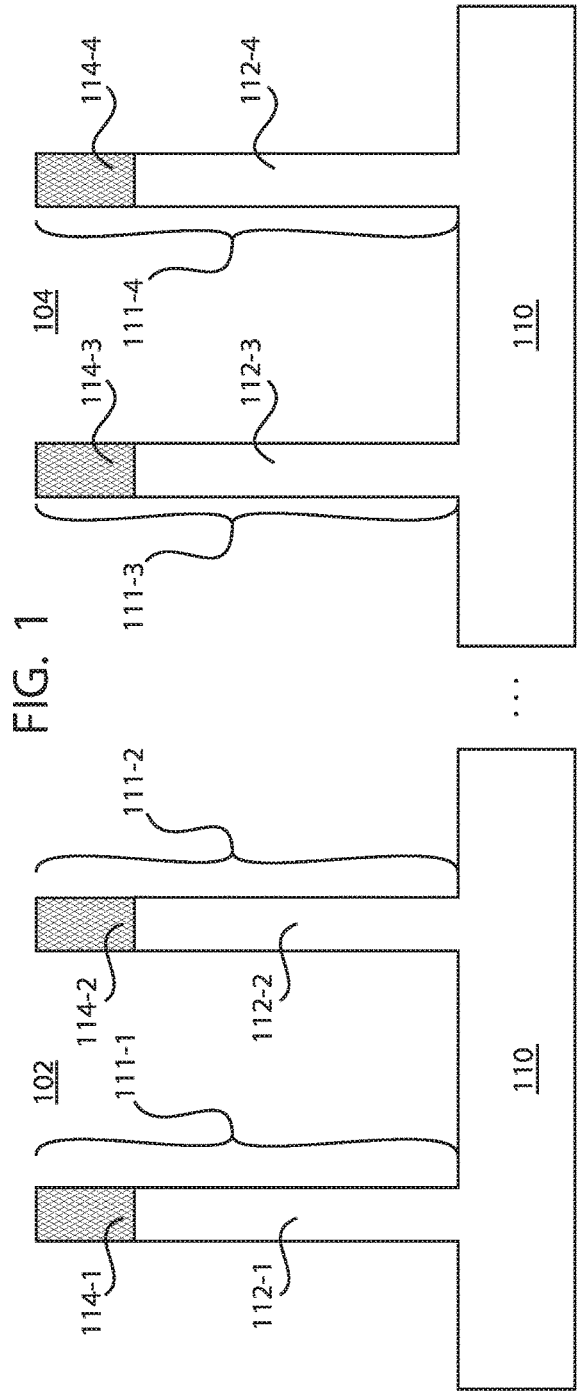
FIG. 1 is a cross-sectional view of the formation of fin structures during the fabrication of a semiconductor device, in accordance with an embodiment of the present invention.

The embodiments described herein provide for the fabrication of semiconductor devices including vertical transistors having uniform channel length. The vertical transistors can have substantially uniform work function metal (WFM) thickness along the channel, which can reduce variation of semiconductor device performance. For example, the embodiments described herein can provide for the fabrication of a complementary metal-oxide semiconductor (CMOS) device having substantially uniform WFM thickness on both an n-type field-effect transistor (NFET) and a p-type field-effect transistor (PFET) of the CMOS device. The embodiments described herein can be applied to define an accurate channel length or gate length in vertical transistors, which can have different WFMs for multi-threshold voltage (multi-Vt) purposes.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above"

the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a cross-sectional view of a semiconductor device 100 is provided. The device 100 includes a device region 102 and a device region 104. In one embodiment, one of the device regions 102 and 104 can include an n-type field-effect transistor (NFET) device region and the other of the device regions 102 and 104 can include a p-type FET (PFET) device region. Therefore, the device 100 can include a complementary metal-oxide semiconductor (CMOS) device. In this illustrative example, the device region 102 corresponds to PFET device and the device region 104 corresponds to an NFET device. However, such an embodiment should not be considered limiting.

As shown, the device 100 includes a substrate 110. The substrate 110 can include any suitable substrate structure, e.g., a bulk semiconductor, a semiconductor-on-insulator (SOI) substrate, etc. In one example, the substrate 110 can include a silicon-containing material. Illustrative examples of Si-containing materials suitable for the substrate 110 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

As further shown, a plurality of fin structures are formed from the substrate 110, including fin structures 111-1 and 111-2 formed in the device region 102 and fin structures 111-3 and 111-4 formed in the device region 104. More specifically, the fin structure 111-1 can include a fin 112-1 and a mask 114-1 disposed on the fin 112-1, the fin structure 111-2 can include a fin 112-2 and a mask 114-2 disposed on the fin 112-2, the fin structure 111-3 can include a fin 112-3 and a mask 114-3 disposed on the fin 112-3, and the fin structure 111-4 can include a fin 112-4 and a mask 114-4 disposed on the fin 112-4. The fin structures 111-1 through 111-4 can be formed from the substrate 110 using any suitable process in accordance with the embodiments described herein.

The masks 114-1 through 114-4 can include any suitable material in accordance with the embodiments described herein. In one embodiment, the masks 114-1 through 114-4 include a hardmask material. For example, masks 114-1 through 114-4 can include, e.g., a silicon nitride material (e.g., SiN), although other hardmask materials are contemplated.

Figure 2:
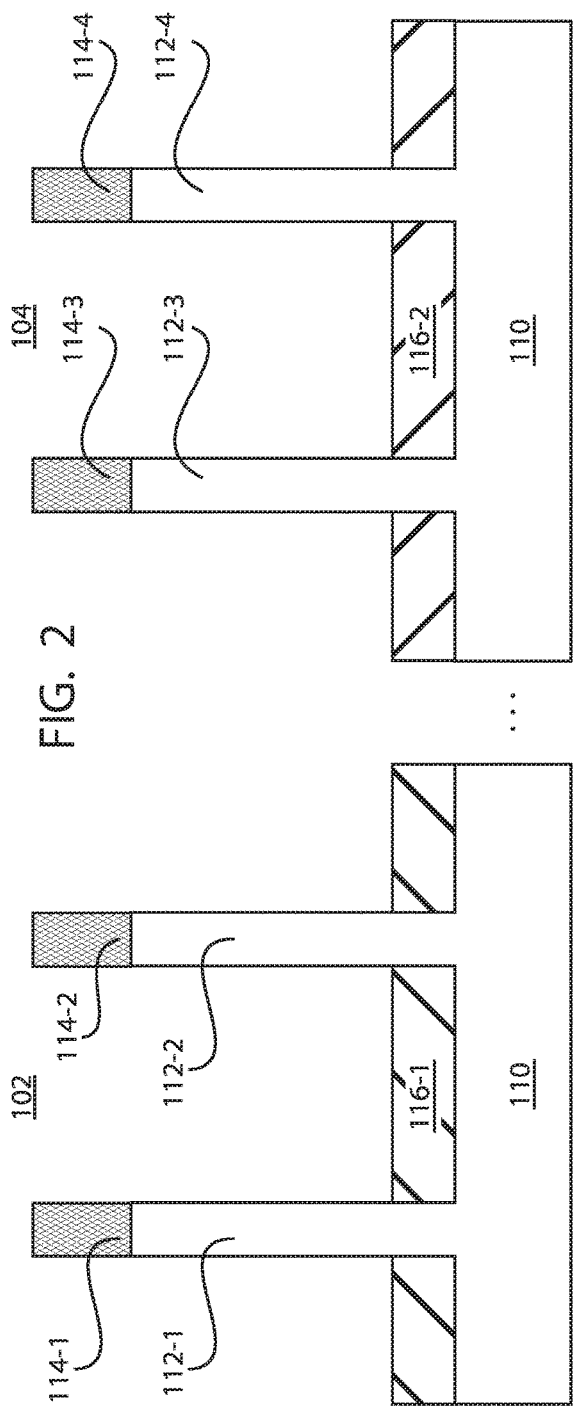
FIG. 2 is a cross-sectional view of the formation of bottom source/drain regions during the fabrication of the semiconductor device, in accordance with an embodiment of the present invention.

With reference to FIG. 2, a plurality of bottom source/drain regions are formed on the substrate 110, including a bottom source/drain region 116-1 formed in the device region 102 and a bottom source/drain region 116-2 formed in the device region 104. In the embodiment in which the device region 102 corresponds to a PFET device and the device region 104 corresponds to an NFET device, the bottom source/drain region 116-1 can include a p-type doped layer (e.g., a boron doped silicon germanium layer) and the bottom source/drain region 116-2 can include an n-type doped layer (e.g., a phosphorus or arsenic doped silicon layer). However, such embodiments should not be considered limiting.

The bottom source/drain regions 116-1 and 116-2 can be formed via epitaxial growth. For example, the bottom source/drain regions 116-1 and 116-2 can be formed by forming a semiconductor layer on the substrate 110 in device regions 102 and 104, respectively, and epitaxially growing material on the semiconductor layer with in-situ doping during epitaxial growth. Dopants can then be driven downwards into the semiconductor layer. The epitaxy layer, in conjunction with the semiconductor layer of the substrate, can form the bottom source/drain regions 116-1 and 116-2.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

Further details regarding the formation of the bottom source/drain regions 116-1 and 116-2 are provided below with reference to FIG. 12.

Figure 3:
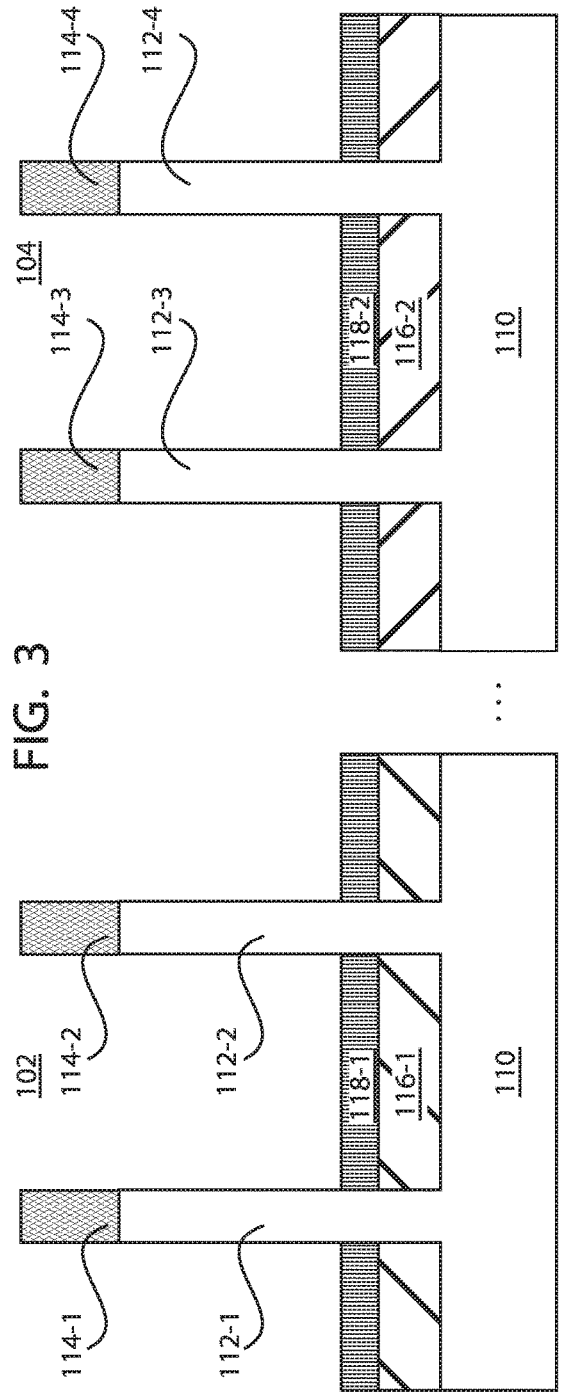
FIG. 3 is a cross-sectional view of the formation of bottom spacers during the fabrication of the semiconductor device, in accordance with an embodiment of the present invention.

With reference to FIG. 3, bottom spacers 118-1 and 118-2 are formed on the bottom source/drain regions 116-1 and 116-2, respectively. The bottom spacers 118-1 and 118-2 can be formed by using any suitable process in accordance with the embodiments described herein. Additionally, the bottom spacers 118-1 and 118-2 can include any suitable material in accordance with the embodiments described herein. For example, the bottom spacers 118-1 and 118-2 can include, e.g., a silicon nitride material (e.g., SiN), although other suitable materials are contemplated. Although each of the bottom spacers 118-1 and 118-2 is depicted as a single layer, they can include a single layer or multiple layers.

Figure 4:
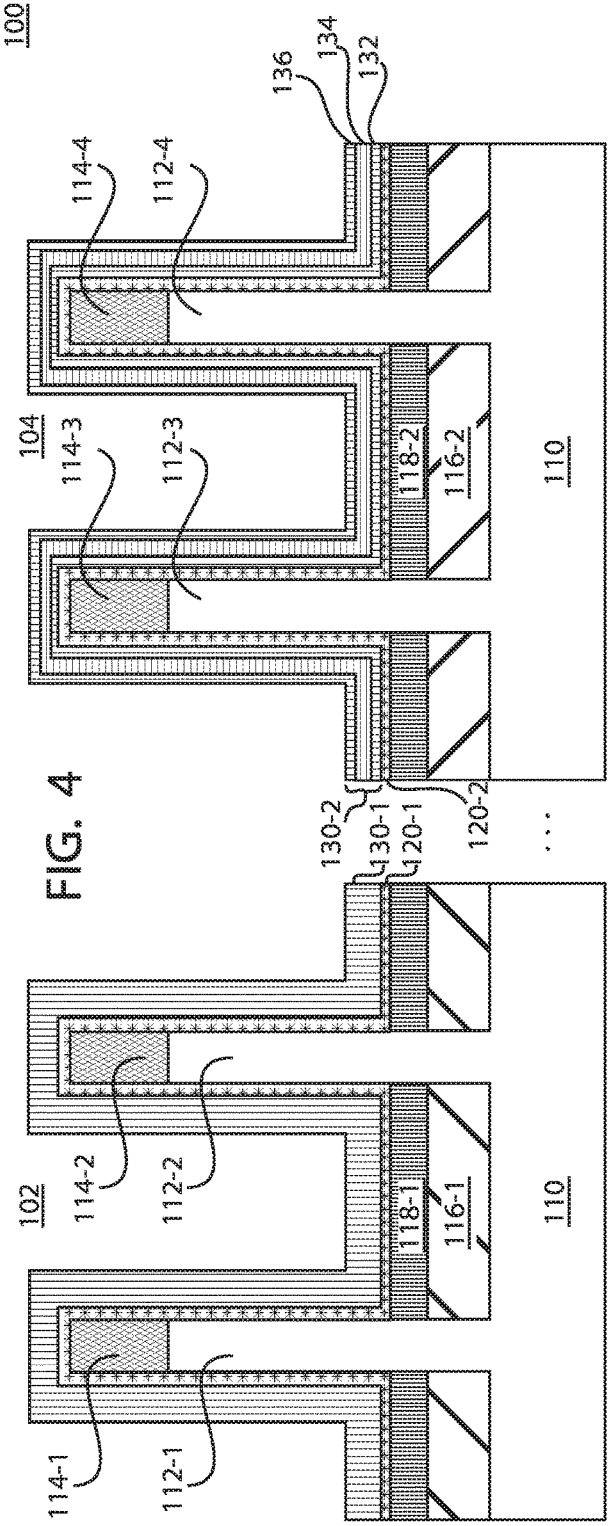
FIG. 4 is a cross-sectional view of the formation of gate material during the fabrication of a semiconductor device, in accordance with an embodiment of the present invention.

With reference to FIG. 4, gate material is formed in the first and second device regions 102 and 104. More specifically, a gate dielectric layer 120-1 is formed in the device region 102 and gate conductor material 130-1 is formed on the gate dielectric layer 120-1, and a gate dielectric layer 120-2 is formed in the device region 104 and gate conductor material 130-2 is formed on the gate dielectric layer. For example, the gate dielectric layer 120-1 can be conformally deposited along the fins 112-1 and 112-2, the masks 114-1 and 114-2 and the bottom spacer 118-1 and the gate conductor material 130-1 can be conformally deposited along the gate dielectric layer 120-1. Additionally, the gate dielectric layer 120-2 can be conformally deposited along the fins 112-3 and 112-4, the masks 114-3 and 114-4 and the bottom spacer 118-2, and the gate conductor material 130-2 can be conformally deposited along the gate dielectric layer 120-2.

The gate dielectric layer 120-1 and 120-2 can include any suitable material in accordance with the embodiments described herein. In one embodiment, the gate dielectric layers 120-1 and 120-2 can include a high-k dielectric material. As used herein, a high-k dielectric material refers to a dielectric material having a dielectric constant (k) higher than the dielectric constant of silicon oxide at room temperature (e.g., about 20° C. to about 25° C.) and atmospheric pressure (about 1 atm). For example, a high-k dielectric material can have a dielectric constant greater than 4.0. In another example, the high-k gate dielectric material can have a dielectric constant greater than 7.0. Examples of suitable high-k dielectric materials that the gate dielectric layers 120-1 and 120-2 can be formed from include, but are not limited to, hafnium oxides, hafnium silicon oxides, hafnium silicon oxynitrides, lanthanum oxides, lanthanum aluminum oxides, zirconium oxides, zirconium silicon oxides, zirconium silicon oxynitrides, tantalum oxides, titanium oxides, barium strontium titanium oxides, barium titanium oxides, strontium titanium oxides, yttrium oxides, aluminum oxides, lead scandium tantalum oxides, lead zinc niobates, etc. In one embodiment, the gate dielectric layers 120-1 and 120-2 each have a thickness ranging from, e.g., about 1 nm to about 10 nm. In another embodiment, the gate dielectric layers 120-1 and 120-2 can each have a thickness ranging from, e.g., about 1.5 nm to about 2.5 nm.

The gate dielectric layers 120-1 and 120-2 can be formed using a chemical vapor deposition (CVD) process and/or an atomic layer deposition (ALD) process. Variations of CVD processes suitable for depositing the at least one gate dielectric layers 124-1 and 124-2 include, but are not limited to, atmospheric pressure CVD (APCVD), low-pressure CVD (LPCVD), plasma-enhanced CVD (PECVD), metalorganic CVD (MOCVD), etc.

The gate conductor materials 130-1 and 130-2 can include any suitable conductive material in accordance with the embodiments described herein. Example of suitable conductive materials that the gate conductor materials 130-1 and 130-2 can be formed from include, but are not limited to metals, metal alloys, metal nitrides and metal silicides, as well as laminates thereof and composites thereof. Examples of suitable conductive materials that can be used to form the gate conductors 126-1 and 126-2 include, but are not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotube, conductive carbon, graphene, etc. The conductive material can further include dopants that are incorporated during or after deposition.

In one embodiment, the gate conductor material 130-1 can be a work function metal (WFM) including a titanium material. More specifically, the gate conductor material 130-1 can include, e.g., TiN. The gate conductor material 130-1 can have a thickness ranging from, e.g., about 2 nm to about 6 nm. More specifically, the gate conductor material 130-1 can have a thickness of about, e.g., 4 nm.

In one embodiment, the gate conductor material 130-2 can be a WFM stack including a plurality of WFM layers 132, 134 and 136. For example, each of the plurality of WFM layers 132, 134 and 136 can include a titanium material. More specifically, the WFM layer 132 can include, e.g., TiN, the WFM layer 134 can include, e.g., TiAlC, and the WFM layer 136 can include, e.g., TiN. That is, the gate conductor material 130-2 can illustratively be a TiN/TiAlC/TiN stack. The WFM layers 132-136 can each have a thickness ranging from, e.g., about 1 nm to about 6 nm. More specifically, the WFM layers 132 and 136 can have a thickness of about, e.g., 1 nm and the WFM layer 134 can have a thickness of, e.g., about 3 nm.

The gate conductor materials 130-1 and 130-2 be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Figure 5:
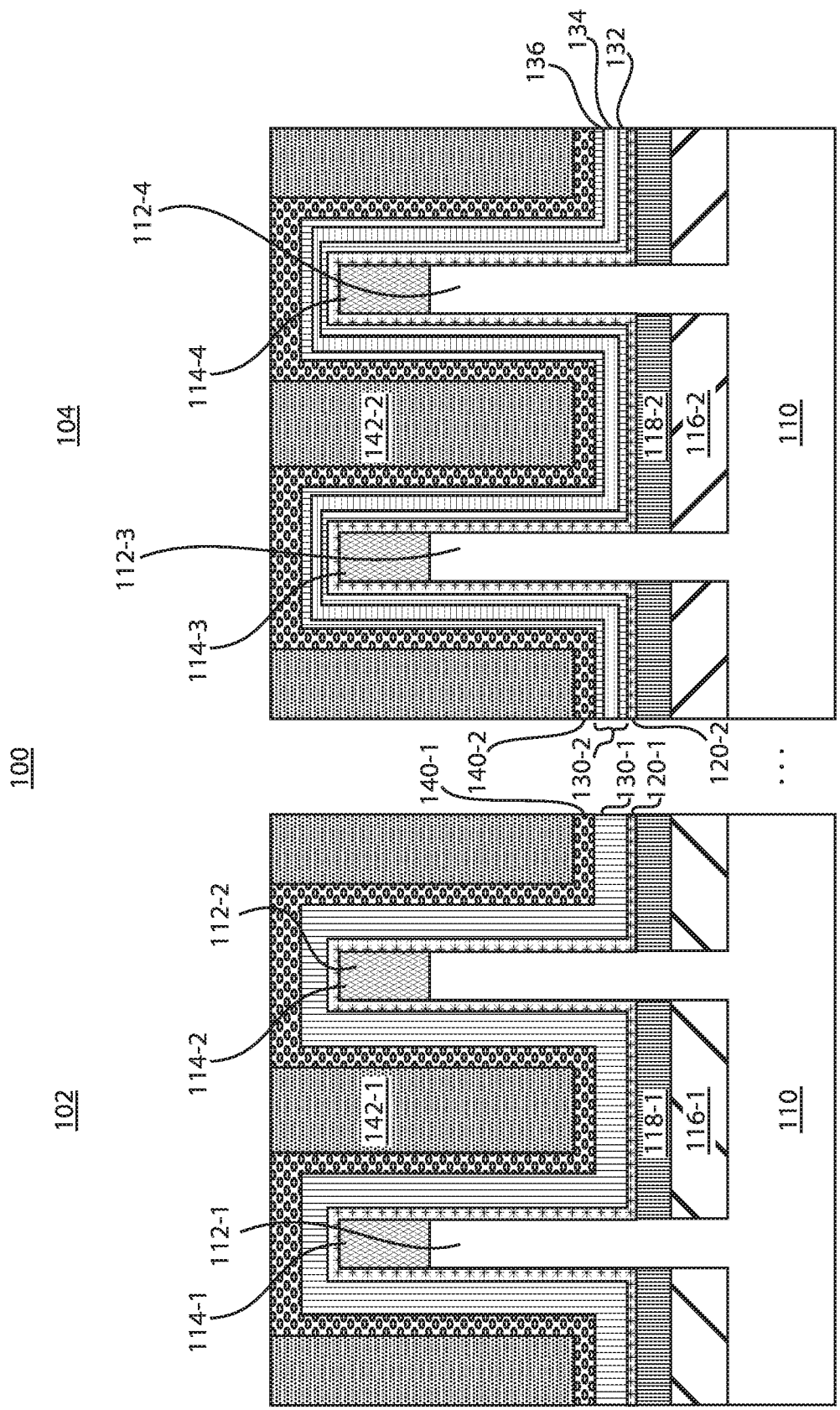
FIG. 5 is a cross-sectional view of the formation of an encapsulation layer during the fabrication of a semiconductor device, in accordance with an embodiment of the present invention.

With reference to FIG. 5, an encapsulation layer 140-1 is formed on the gate conductor material 130-1, and an encapsulation layer 140-2 is formed on the gate conductor material 130-2. For example, the encapsulation layers 140-1 and 140-2 can be conformally deposited along the gate conductor materials 130-1 and 130-2, respectively. The encapsulation layers 140-1 and 140-2 can be formed using any suitable process in accordance with the embodiments described herein, and can include any suitable material in accordance with the embodiments described herein. For example, the encapsulation layers 140-1 and 140-2 can include, e.g., a silicon nitride material (e.g., SiN), although other suitable materials are contemplated.

As further shown, an interlayer dielectric (ILD) layer 142-1 is formed in the device region 102 on the encapsulation layer 140-1 and an ILD layer 142-2 is formed in the device region 104 on the encapsulation layer 140-2. The ILD layers 142-1 and 142-2 can be formed using any suitable process in accordance with the embodiments described herein. For example, the ILD layers 142-1 and 142-2 can be formed by depositing a dielectric material fill, and planarizing the dielectric material fill (e.g., using chemical-mechanical planarization (CMP)). The ILD layers 142-1 and 142-2 can include any suitable material in accordance with the embodiments described herein. For example, the ILD layers 142-1 and 142-2 can include, e.g., a silicon oxide material (e.g., $SiO_2$).

Figure 6:
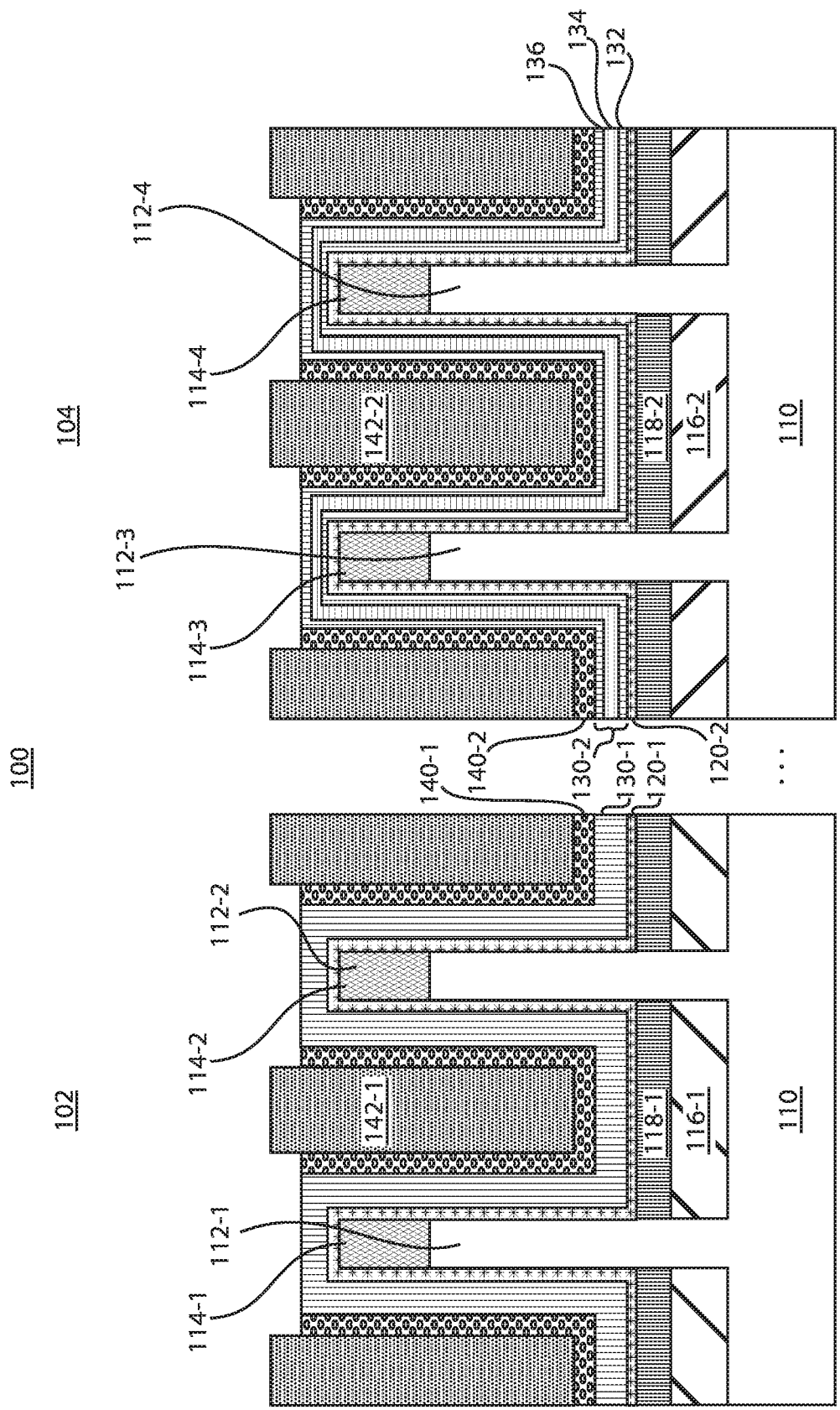
FIG. 6 is a cross-sectional view of the removal of portions of the encapsulation layer during the fabrication of the semiconductor device, in accordance with an embodiment of the present invention.

With reference to FIG. 6, portions of the encapsulation layers 140-1 and 140-2 are removed to expose top portions of the gate conductor material 130-1 and the gate conductor material 130-2 (e.g., the top portion of the WFM layer 136). Any suitable process can be used to remove the portions of the encapsulation layers 140-1 and 140-2 in accordance with the embodiments described herein. For example, a selective etch process (e.g., selective reactive-ion etch (RIE)) can be used to remove the portions of the encapsulation layers 140-1 and 140-2.

Figure 7:
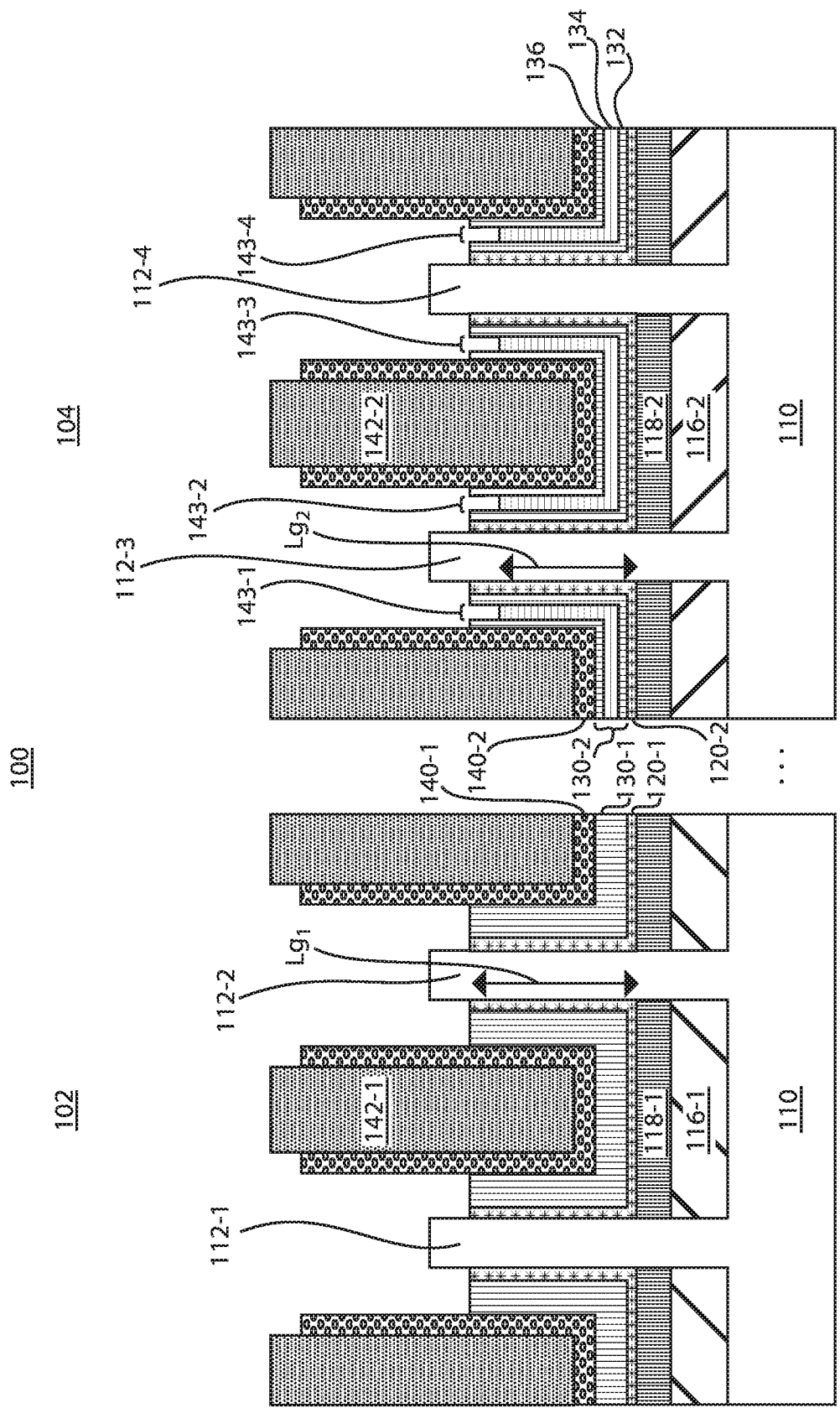
FIG. 7 is a cross-sectional view of processing performed to define channel lengths and form divots during the fabrication of the semiconductor device, in accordance with an embodiment of the present invention.

With reference to FIG. 7, the gate material in the device regions 102 and 104 can be recessed to define channel lengths corresponding to the device regions 102 and 104 using a vertical wet etch process. As shown in FIG. 7, a channel length $Lg_1$ of the fins 112-1 and 112-2 can be defined, after the recessing, from the bottom of the gate dielectric layer 120-1 to the top of the gate conductor material 130-1, and a channel length $L_{g2}$ of the fins 112-3 and 112-4 can be defined from the bottom of the gate dielectric layer 120-2 and a height of the layer 134 of the gate conductor material 130-2. In one embodiment, the vertical wet etch process utilizes a standard clean-1 (SC-1) wet etch solution including $H_2O_2$:$NH_4OH$:$H_2O$.

The layers of the gate conductive materials 130-1 and 130-2 can have different wet etch rates. For example, TiAlC has about a three-fold faster etch rate than TiN using, e.g., the SC1 wet etch solution including $H_2O_2$:$NH_4OH$:$H_2O$. Due to these different wet etch rates, over etch can result in non-uniform channel length or threshold voltage (Vt) variation occurring between the device regions 102 and 104. Additionally, divots 143-1 through 143-4 can be formed within the device region 104 due to the faster etch rate of the WFM layer 134 (e.g., TiAlC), as compared to the WFM layers 132 and 136 (e.g., TiN).

Figure 8:
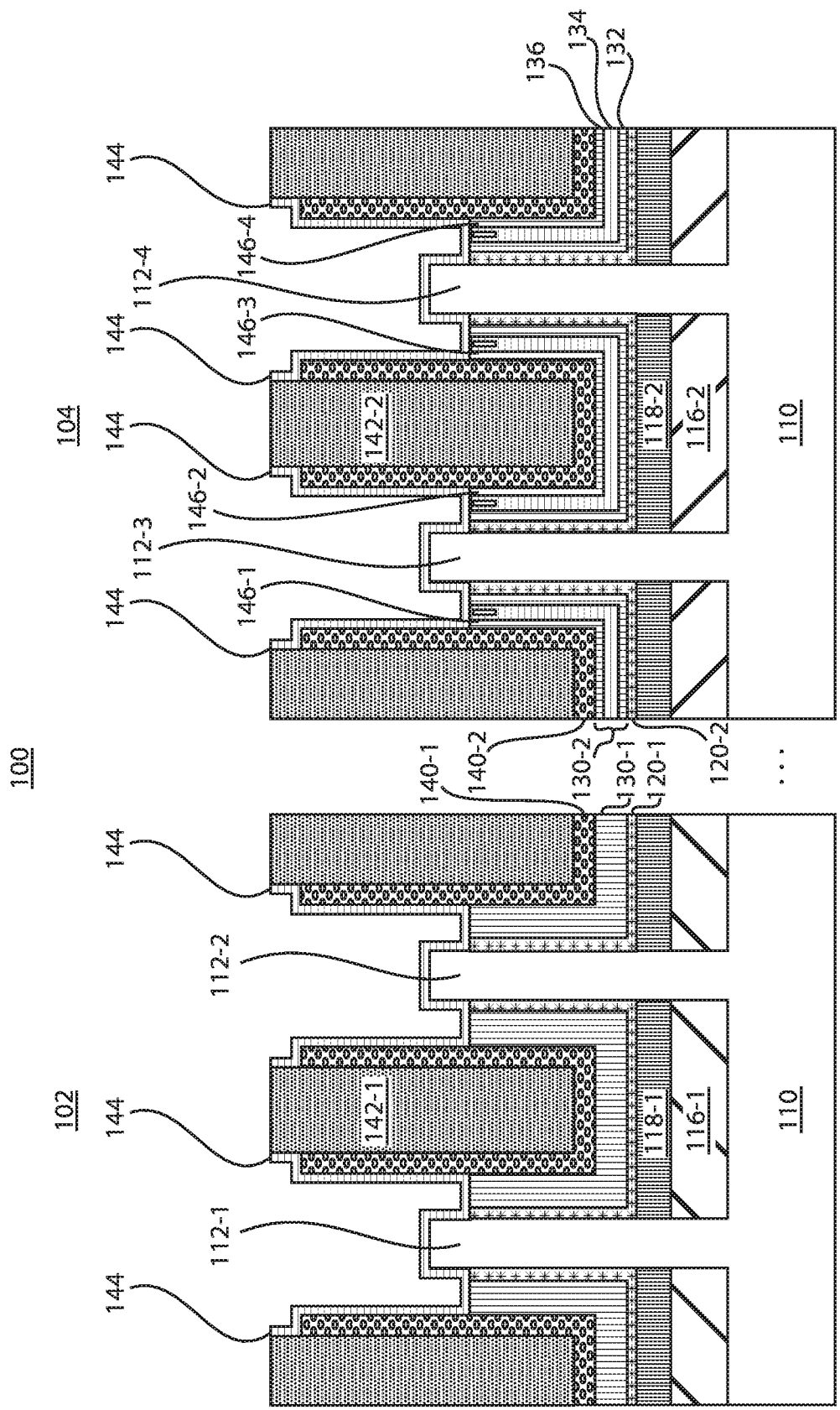
FIG. 8 is a cross-sectional view of the formation of additional gate material during the fabrication of the semiconductor device, in accordance with an embodiment of the present invention.

With reference to FIG. 8, additional gate conductor material 144 is formed. The purpose of the additional gate conductor material 144 is to fill the divots 143-1 through 143-4 to create seams 146-1 through 146-4, respectively. The additional gate conductor material 144 can include any suitable material in accordance with the embodiments described herein. More specifically, the additional gate conductor material can include a same or similar material as the layer 134. For example, in the embodiment in which the layer 134 includes TiAlC, the additional gate conductor material 144 can also include TiAlC.

As shown, in addition to filling the divots 143-1 through 143-4 to form the seams 146-1 through 146-4, respectively, the additional gate conductor material 144 can be deposited (e.g., conformally deposited) along sidewalls of the encapsulation layers 140-1 and 140-2, the ILD layers 142-1 and 142-2, the gate conductor materials 130-1 and 130-2, the gate dielectric layers 120-1 and 120-2, and the fins 112-1 through 112-4.

Figure 9:
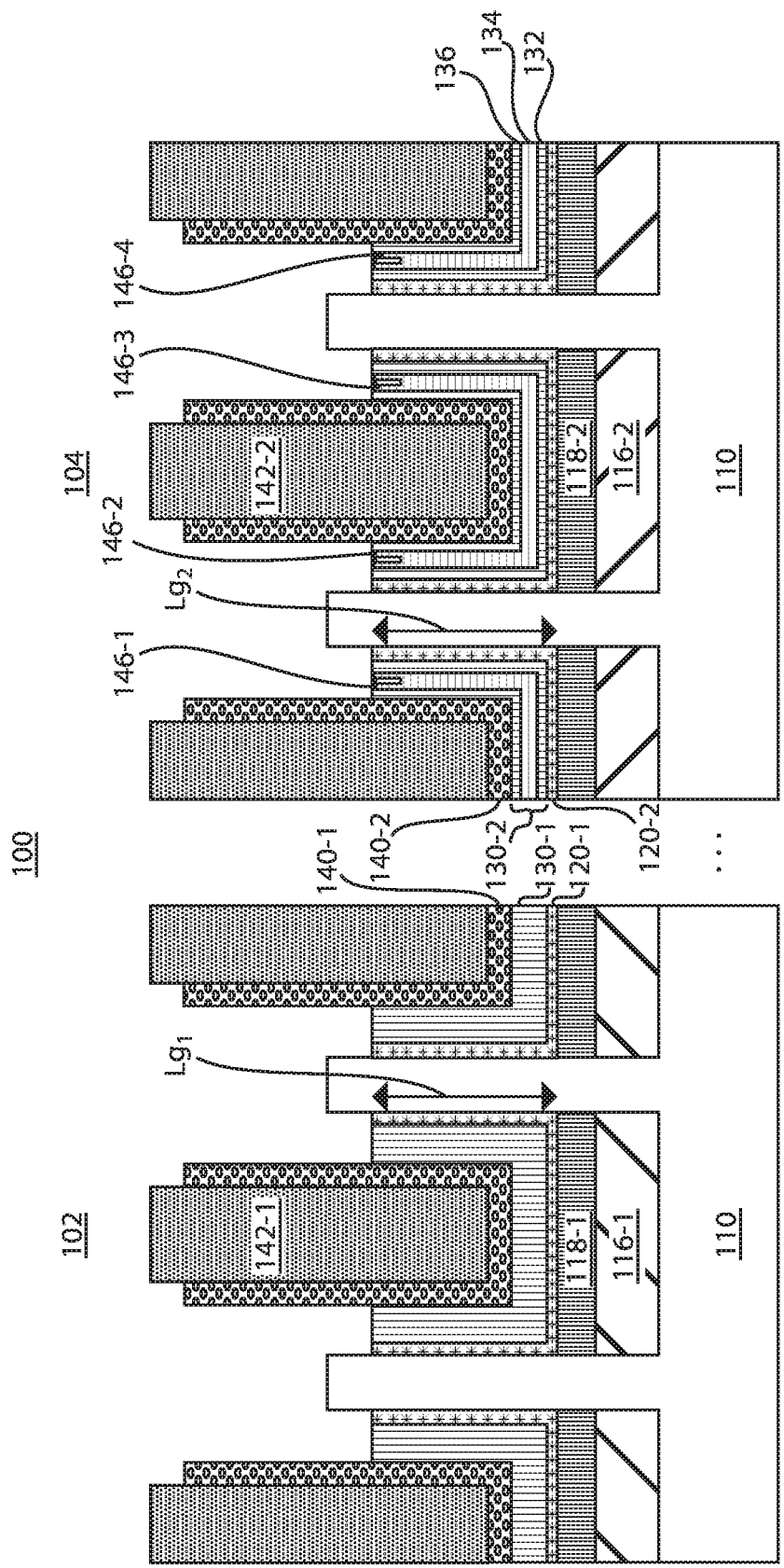
FIG. 9 is a cross-sectional view of an etch back of the additional gate material during the fabrication of the semiconductor device, in accordance with an embodiment of the present invention.

With reference to FIG. 9, the additional gate conductor material 144 is etched back. The etch back of the additional gate conductor materials 144 results in the removal of the additional gate conductor material 144, except for the seams 146-1 through 146-4. As shown, due to the seams 146-1 through 146-4, the previous channel length $L_{g2}$ of the fins 112-3 and 112-4 is modified to be the same as, or at least substantially similar to, the channel length $L_{g1}$ of the fins 112-1 and 112-2. The additional gate conductor material 144 can be etched back using any suitable process in accordance with the embodiments described herein. For example, the additional gate conductor material 144 can be etched back using a wet etch chemistry (e.g., SC-1).

The processes described with reference to FIGS. 4-9 provide for an integration scheme of providing substantially uniform channel length in vertical transistor devices (e.g., VFETs) by fabricating the vertical transistor devices with substantially uniform gate conductor material (e.g., WFM) thickness along the channels of the devices within the device regions 102 and 104 (e.g., PFET and NFET devices). More specifically, a two-step gate conductor material (e.g., WFM) deposition process is implemented to recover over etch resulting from the recessing of the gate material during channel length definition. This uniformity can reduce the variation of device performance. For multi-Vt purposes, the devices within the device regions 102 and 104 can have different bottom gate conductor material (e.g., bottom WFM) thickness. For example, the devices within the device regions 102 and 104 can have, e.g., different bottom TiN thicknesses.

Figure 10:
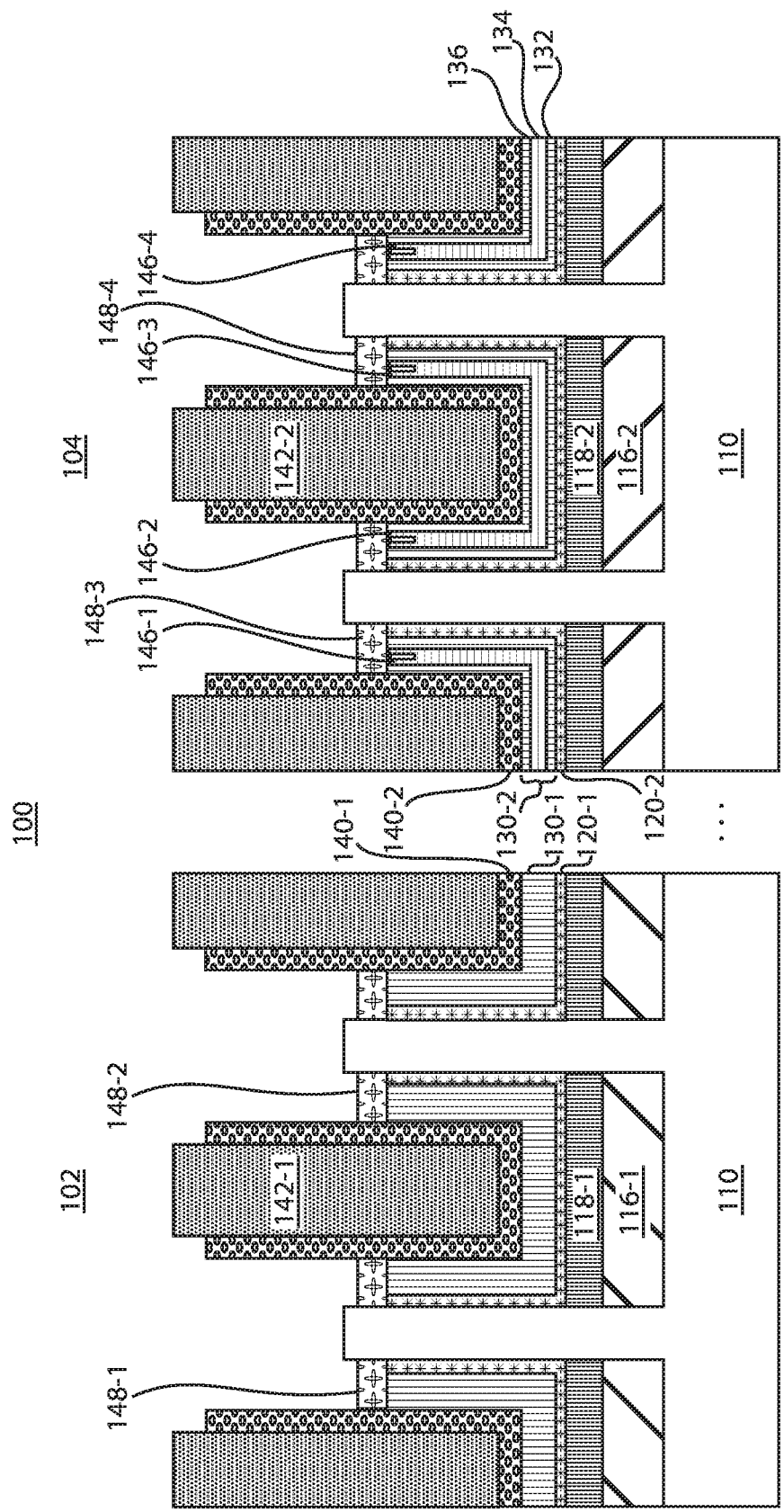
FIG. 10 is a cross-sectional view of the formation of top spacers during the fabrication of the semiconductor device, in accordance with another embodiment of the present invention.

With reference to FIG. 10, a top spacer layers 148-1 through 148-4 are formed. More specifically, the top spacer layer 148-1 is formed on the gate material in regions between the encapsulation layer 140-1 and the fin 112-1, the top spacer layer 148-2 is formed on the gate material in regions between the encapsulation layer 140-1 and the fin 112-2, the top spacer layer 148-3 is formed on the gate material in regions between the encapsulation layer 140-2 and the fin 112-3, and the top spacer layer 148-4 is formed on the gate material in regions between the encapsulation layer 140-2 and the fin 112-4.

The top spacer layers 148-1 through 148-4 can be formed using any suitable process in accordance with the embodiments described herein. For example, the top spacer layers 148-1 through 148-4 can be formed by depositing top spacer material and etching back the top spacer material using any suitable etch process. The top spacer layers 148-1 through 148-4 can include any suitable material in accordance with the embodiments described herein. For example, the top spacer layers 148-1 through 148-4 can include, e.g., a silicon nitride material (e.g., SiN), although other suitable materials are contemplated.

Figure 11:
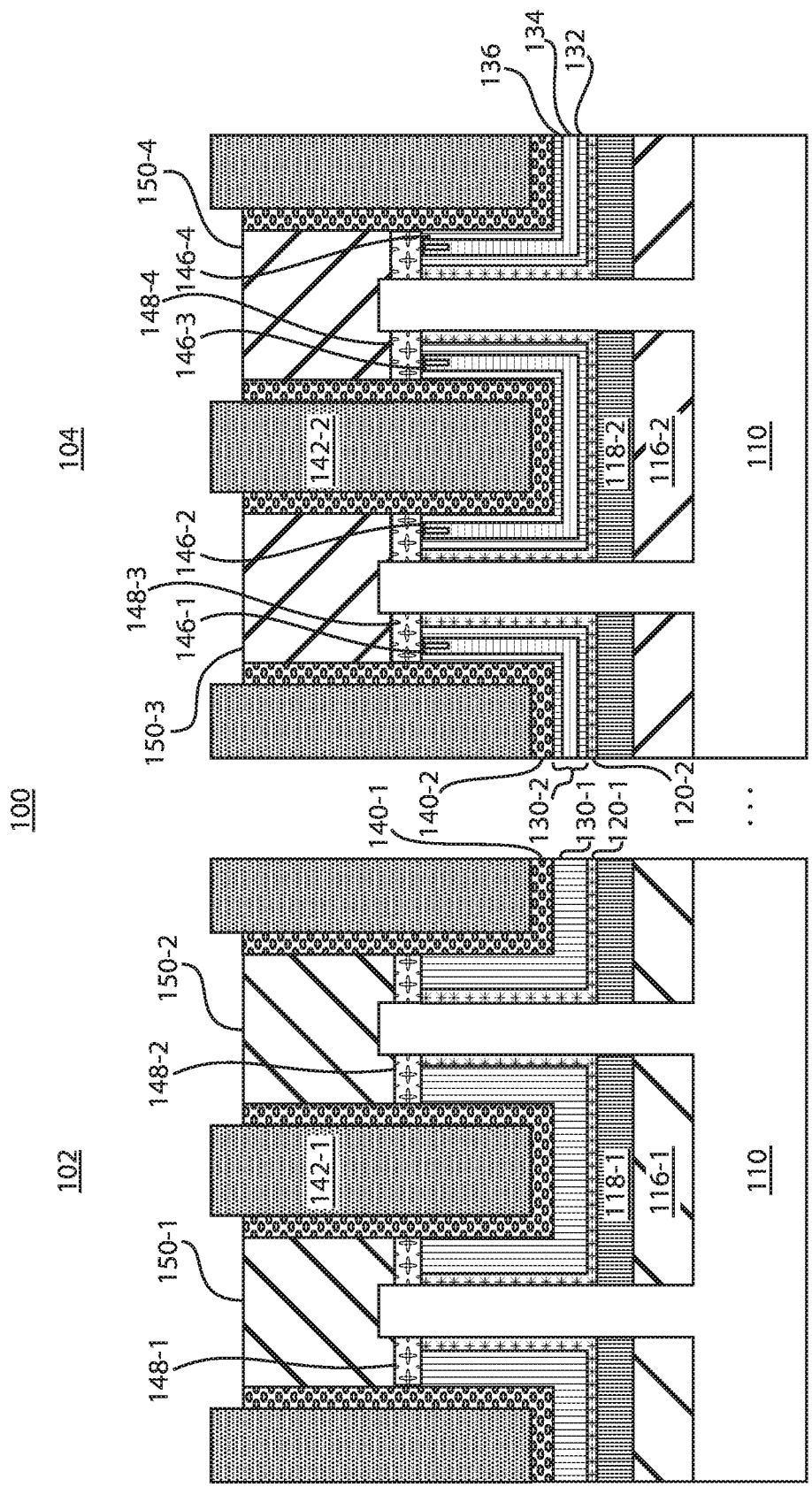
FIG. 11 is a cross-sectional view of the formation of top source/drain regions during the fabrication of the semiconductor device, in accordance with an embodiment of the present invention.

With reference to FIG. 11, top source/drain regions 150-1 through 150-4 are formed. More specifically, top source/drain region 150-1 is formed on fin 112-1 and top spacer layer 148-1, top source/drain region 150-2 is formed on fin 112-2 and top spacer layer 148-2, top source/drain region 150-3 is formed on fin 112-3 and top spacer layer 148-3, and top source/drain region 148-4 is formed on fin 112-4 and top spacer layer 148-4. The top source/drain regions 150-1 through 150-4 can each include an epitaxially grown material. For example, in the embodiment in which the device region 102 corresponds to a PFET and the device region 104 corresponds to an NFET, the top source/drain regions 150-1 and 150-2 can include a p-type doped layer (e.g., a boron doped silicon germanium layer), and the top source/drain regions 150-3 and 150-4 can include an n-type doped layer (e.g., a phosphorus or arsenic doped silicon layer). However, such an embodiment should not be considered limiting.

Further downstream processing can be performed to finish fabrication of the device 100.

Figure 12:
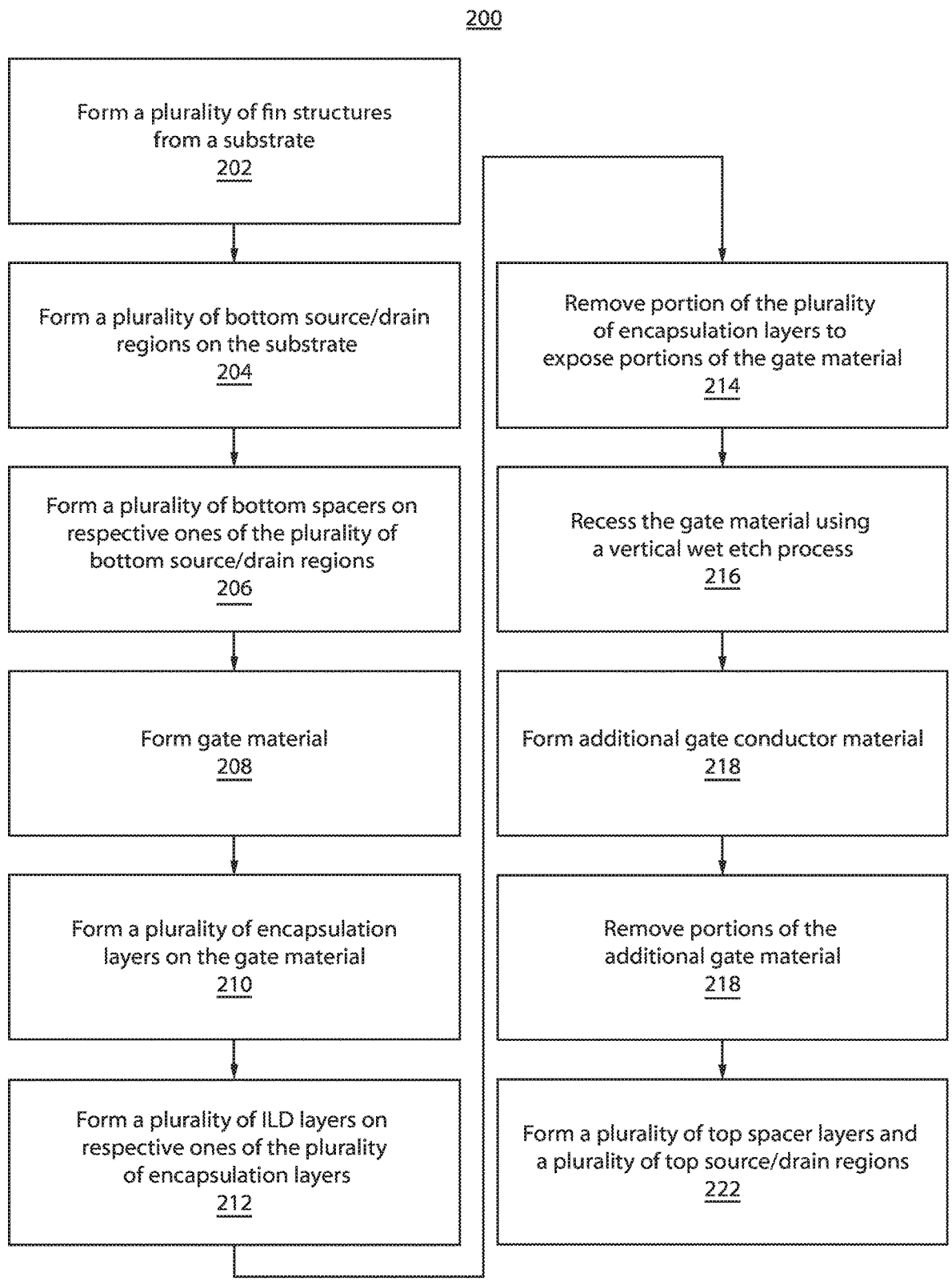
FIG. 12 is a block/flow diagram illustrating a system/method for fabricating a semiconductor device, in accordance with an embodiment of the present invention.

With reference to FIG. 12, a block/flow diagram is provided illustrating a system/method 200 for fabricating a semiconductor device including stacked access device and resistive memory, in accordance with an embodiment.

At block 202, a plurality of fin structures are formed from a substrate. Forming the plurality of fin structures can include forming at least one first fin structure within a first device region associated with a first device, and forming at least one second fin structure within a second device region associated with a second device. Each of the plurality of fin structures can include a fin and a mask disposed on the fin. That is, the at least one first fin structure can include at least one first fin, and the at least one second fin structure can include at least one second fin. The plurality of fin structures can be formed using any suitable process in accordance with the embodiments described herein. In one embodiment, one of the device regions can include an n-type field-effect transistor (NFET) device region and the other of the device regions can include a p-type FET (PFET) device region. For example, the first device region can correspond to a PFET device and the second device region can correspond to an NFET device. However, such an embodiment should not be considered limiting. Accordingly, the device can include a complementary metal-oxide semiconductor (CMOS) device. Further details regarding block 202 are described above with reference to FIG. 1.

At block 204, a plurality of bottom source/drain regions are formed on the substrate. Forming the plurality of bottom source/drain regions can include forming a first bottom source/drain region in the first device region, and forming a second bottom source/drain region in the second device region. The first and second bottom source/drain regions can be formed via epitaxial growth. In the embodiment in which the first device region corresponds to a PFET device and the second device region corresponds to an NFET device, the first bottom source/drain region can include a p-type doped layer (e.g., a boron doped silicon germanium layer) and the second bottom source/drain region can include an n-type doped layer (e.g., a phosphorus or arsenic doped silicon layer). However, such embodiments should not be considered limiting. Further details regarding block 204 are described above with reference to FIG. 2.

At block 206, a plurality of bottom spacers are formed on respective ones of the plurality of bottom source/drain regions. Forming the plurality of bottom source/drain regions can include first and second bottom spacers are formed on the first and second bottom source/drain regions, respectively. The plurality of bottom spacers can be formed by using any suitable process in accordance with the embodiments described herein. Further details regarding block 206 are described above with reference to FIG. 3.

At block 208, gate material is formed. Forming the gate material can include forming first gate material in the first device region and forming second gate material in the second device region. More specifically, the first gate material can include a first gate dielectric layer and first gate conductor material, and the second gate material can include a second gate dielectric layer and second gate conductor material. For example, the first gate dielectric layer can be conformally deposited along the at least one first fin structure and the first bottom spacer, and the first gate conductor material can be conformally deposited along the first gate dielectric layer. Additionally, the second gate dielectric layer can be conformally deposited along the at least one second fin structure and the second bottom spacer, and the second gate conductor material can be conformally deposited along the second gate dielectric layer. The first and second gate conductor materials be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

The first and second gate dielectric layers and gate conductor materials can include any suitable material in accordance with the embodiments described herein. For example, the first gate conductor material can include a layer of a first material. In one embodiment, the first gate conductor material can include a layer of TiN. The first gate conductor material can have a thickness ranging from, e.g., about 2 nm to about 6 nm. More specifically, the first gate conductor material can have a thickness of about, e.g., 4 nm. In one embodiment, the second gate conductor material can include a stack including a plurality of layers. For example, the stack can include a layer of the first material (e.g., TiN), a second layer of a second material having a different etch rate than the first material (e.g., TiAlC) and another layer of the first material (e.g., TiN). That is, the second gate conductor material can include a TiN/TiAlC/TiN stack. The layers of the stack can each have a thickness ranging from, e.g., about 1 nm to about 6 nm. More specifically, first and third WFM layers can have a thickness of about, e.g., 1 nm and the second WFM layer can have a thickness of, e.g., about 3 nm.

Further details regarding block 208 are described above with reference to FIG. 4.

At block 210, a plurality of encapsulation layers are formed on the gate material. Forming the plurality of encapsulation layer can include conformally depositing first and second encapsulation layers along the first and second gate conductor materials, respectively. The plurality of encapsulation layers can be formed using any suitable process in accordance with the embodiments described herein.

At block 212, a plurality of interlayer dielectric (ILD) layers are formed on respective ones of the plurality of encapsulation layers. Forming the plurality of ILD layers can include forming a first ILD layer in the first device region on the first encapsulation layer, and forming a second ILD layer in the second device region on the second encapsulation layer. The plurality of ILD layers can be formed using any suitable process in accordance with the embodiments described herein. For example, the plurality of ILD layers be formed by depositing a dielectric material fill, and planarizing the dielectric material fill (e.g., using chemical-mechanical planarization (CMP)).

Further details regarding blocks 210 and 212 are described above with reference to FIG. 5.

At block 214, portions of the plurality of encapsulation layers are removed to expose portions of the gate material. For example, portions of the first and second encapsulation layers can be removed to expose portions (e.g., top portions) of the first and second gate conductor materials, respectively. Any suitable process can be used to remove the portions of the plurality of encapsulation layers in accordance with the embodiments described herein. For example, a selective etch process (e.g., selective reactive-ion etch (RIE)) can be used. Further details regarding block 214 are described above with reference to FIG. 6.

At block 216, the gate material is recessed using a vertical wet etch process. The layers of the first and second gate conductive materials (e.g., TiN and TiAlC) can have different wet etch rates. For example, TiAlC has about a three-fold faster etch rate than TiN using, e.g., the SC1 wet etch solution including $H_2O_2:NH_4OH:H_2O$. Due to these different wet etch rates, over etch can result in non-uniform channel length or threshold voltage (Vt) variation occurring between the first and second device regions. Additionally, a plurality of divots can be formed within the second device region due to the faster etch rate of the second layer of the second gate conductor material (e.g., TiAlC), as compared to the first and third layers of the second gate conductor material (e.g., TiN). The recessing of the gate material in the first and second device regions can define channel lengths corresponding to the first and second device regions. More specifically, a first channel length corresponding to the at least one first fin, and a second channel length corresponding to the at least one second fin. The first channel length can be defined between the first gate dielectric layer and the first gate conductor material (e.g., from the bottom of the first gate dielectric layer and the top of the first gate conductor material), and the second channel length can be defined between the second gate dielectric layer and the second gate conductor material (e.g., from the bottom of the second gate dielectric layer and the bottom of each of the top of the second layer of the second conductive material). Further details regarding block 216 are described above with reference to FIG. 7.

At block 218, additional gate conductor material is formed. Forming the additional gate conductor material can include depositing (e.g., conformally depositing) a layer of the additional gate conductor material along sidewalls of the first and second encapsulation layers, the first and second ILD layers, the first and second gate conductor materials, the first and second gate dielectric layers and the fins, and etching back the layer of the additional gate conductor material. For example, the additional gate conductor material can be etched back using a wet etch chemistry (e.g., SC1). The additional gate conductor material can include any suitable material in accordance with the embodiments described herein. For example, in the embodiment in which the second layer of the second conductive material includes TiAlC, the additional gate conductor material can include TiAlC. Forming the additional gate conductor material can include filling the plurality of divots in the second device region to create a plurality of seams. The presence of the plurality of seams can modify the second channel length to a channel length that is the same as, or substantially similar to, the first channel length. Accordingly, a uniform or substantially uniform channel length can be achieved between the first and second device regions.

At block 220, portions of the additional gate material are removed. For example, the portions of the additional gate material not used to form the plurality of seams in the second device region are removed.

Further details regarding blocks 218 and 220 are described above with reference to FIGS. 8 and 9.

At block 222, a plurality of top spacer layers and a plurality of top source/drain regions are formed.

Regarding the formation of the plurality of top spacer layers, at least one first top spacer layer can be formed on the first gate material, and at least one second top spacer layer can be formed on the second gate material. The plurality of top spacer layers can be formed using any suitable process in accordance with the embodiments described herein. For example, the plurality of top spacer layers can be formed by depositing top spacer material and etching back the top spacer material using any suitable etch process. The plurality of top spacer layers can include any suitable material in accordance with the embodiments described herein. For example, the plurality of top spacer layers can include, e.g., a silicon nitride material (e.g., SiN), although other suitable materials are contemplated.

Regarding the formation of the plurality of top source/drain regions, at least one first top source/drain region can be formed on the at least one first fin and the at least one first top spacer layer, and at least one second top source/drain region can be formed on the at least one second fin and the at least one second top spacer layer. The plurality of top source/drain regions can each include an epitaxially grown material. For example, in the embodiment in which the first device region corresponds to a PFET and the second device region corresponds to an NFET, the at least one first top source/drain region can include a p-type doped layer (e.g., a boron doped silicon germanium layer), and the at least one second top source/drain region can include an n-type doped layer (e.g., a phosphorus or arsenic doped silicon layer). However, such an embodiment should not be considered limiting.

Further details regarding block 222 are described above with reference to FIGS. 10 and 11.

Additional downstream processing can be performed to finish fabrication of the device.

Having described preferred embodiments of a semiconductor device including vertical transistors having uniform channel length and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device including vertical transistors having uniform channel length, comprising:
    defining a channel length of at least one first fin formed on a substrate in a first device region and a channel length of at least one second fin formed on the substrate in a second device region, including creating at least one divot in a second gate conductor material in the second device region; and
    modifying the channel length of the at least one second fin to be substantially similar to the channel length of the at least one first fin by filling the at least one divot with additional gate conductor material.

2. The method of claim 1, wherein the first device region corresponds to a p-type field-effect transistor device and the second device region corresponds to an n-type field-effect transistor device.

3. The method of claim 1, further comprising forming at least one first fin structure including the at least one first fin within the first device region and forming at least one second fin structure including the at least one second fin within the second device region.

4. The method of claim 3, further comprising:
    forming at least one first bottom source/drain region on the substrate in the first device region and at least one second bottom source/drain region on the substrate in the second device region; and
    forming at least one first bottom spacer on the at least one first bottom source/drain region and at least one second bottom spacer on the at least one second bottom source/drain regions.

5. The method of claim 4, further comprising:
    forming first gate material in the first device region, including depositing a first gate dielectric layer along the at least one first fin structure and the at least one first bottom spacer, and depositing first gate conductor material on the first gate dielectric layer; and
    forming second gate material in the second device region, including depositing a second gate dielectric layer along the at least one second fin structure and the at least one second bottom spacer, and depositing second gate conductor material on the second gate dielectric layer;
    wherein defining the channel lengths further includes recessing the first and second gate material using a vertical wet etch process to form the at least one divot as a result of over etch.

6. The method of claim 5, wherein:
    the first gate conductor material includes a layer of a first material; and the second gate conductor material includes a stack having a plurality of layers, the plurality of layers of the stack including a layer of the first material and a layer of a second material having a different etch rate from the first material.

7. The method of claim 6, wherein the first material includes TiN and the second material includes TiAlC.

8. The method of claim 5, further comprising forming first and second encapsulation layers on the first and second gate material prior to recessing the gate material.

9. The method of claim 8, further comprising removing portions of the plurality of encapsulation layers to expose portions of the first and second gate material prior to recessing the gate material.

10. The method of claim 5, wherein the vertical wet etch process uses a standard clean-1 (SC-1) wet etch solution.

11. The method of claim 1, further comprising removing portions of the additional gate conductor material.

12. The method of claim 10, further comprising forming a plurality of top spacer layers and a plurality of top source/drain regions.

13. A method for fabricating a semiconductor device including vertical transistors having uniform channel length, comprising:
    forming first gate material in a first device region associated with a p-type field-effect transistor device, including depositing a first gate dielectric layer along at least one first fin structure including at least one fin formed on a substrate in the first device region and at least one first bottom spacer formed on at least one first bottom source/drain region, and depositing first gate conductor material including a layer of a first material on the first gate dielectric layer;
    forming second gate material in a second device region associated with an n-type field-effect transistor device, including depositing a second gate dielectric layer along at least one second fin structure including at least one second fin formed on the substrate in the second device region and at least one second bottom spacer formed on at least one second bottom source/drain region, and depositing second gate conductor material on the second gate dielectric layer, wherein the second gate conductor material includes a stack having a plurality of layers including a layer of the first material and a layer of a second material having a different etch rate from the first material;
    defining a channel length of the at least one first fin and a channel length of the at least one second fin, including recessing the first and second gate material using a vertical wet etch process, the recessing creating at least one divot in the second device region resulting from over etch; and
    modifying the channel length of the at least one second fin to be substantially similar to the channel length of the at least one first fin by filling the at least one divot with additional gate conductor material.

14. The method of claim 13, further comprising forming the at least one first fin structure within the first device region and forming the at least one second fin structure within the second device region.

15. The method of claim 14, further comprising forming the first and second bottom/source drain regions and the first and second bottom spacers.

16. The method of claim 13, wherein the first material includes TiN and the second material includes TiAlC.

17. The method of claim 13, further comprising, prior to recessing the gate material:
    forming first and second encapsulation layers on the first and second gate material; and
    removing portions of the plurality of encapsulation layers to expose portions of the gate material.

18. The method of claim 13, further comprising:
    removing portions of the additional gate material; and
    forming a plurality of top spacer layers and a plurality of top source/drain regions.

19. The method of claim 13, wherein the vertical wet etch process uses a standard clean-1 (SC-1) wet etch solution.

20. A method for fabricating a semiconductor device, comprising:
    forming a first gate conductor on sidewalls of a first semiconductor fin in a first device region;
    forming a second gate conductor on sidewalls of a second semiconductor fin in a second device region;
    performing an etch in the first device region and the second device region that has a greater etch rate for the second gate conductor than for the first gate conductor, to form a divot in the second gate conductor;
    filling the divot in the second gate conductor with additional gate conductor material.

* * * * *